US012805003B2

(12) United States Patent
Koh et al.

(10) Patent No.: US 12,805,003 B2
(45) Date of Patent: Nov. 17, 2026

(54) TRANSISTOR WITH CHANNEL-SYMMETRIC GATE

(71) Applicant: Intel Corporation, Santa Clara, CA (US)

(72) Inventors: Shao-Ming Koh, Tigard, OR (US); Patrick Morrow, Portland, OR (US); Nikhil Mehta, Portland, OR (US); Leonard Guler, Hillsboro, OR (US); Sudipto Naskar, Portland, OR (US); Alison Davis, Portland, OR (US); Dan Lavric, Portland, OR (US); Matthew Prince, Portland, OR (US); Jeanne Luce, Hillsboro, OR (US); Charles Wallace, Portland, OR (US); Cortnie Vogelsberg, Beaverton, OR (US); Rajaram Pai, Lake Oswego, OR (US); Caitlin Kilroy, Hillsboro, OR (US); Jojo Amonoo, Portland, OR (US); Sean Pursel, Tigard, OR (US); Yulia Gotlib, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/129,700

(22) Filed: Mar. 31, 2023

(65) Prior Publication Data

US 2024/0332290 A1 Oct. 3, 2024

(51) Int. Cl.

| | |
|---|---|
| ***H10D 84/83*** | (2025.01) |
| ***H10D 30/43*** | (2025.01) |
| ***H10D 30/67*** | (2025.01) |
| ***H10D 62/10*** | (2025.01) |
| ***H10P 50/00*** | (2026.01) |
| ***H10P 76/40*** | (2026.01) |

(52) U.S. Cl.

CPC ............ *H10D 84/83* (2025.01); *H10D 30/43* (2025.01); *H10D 30/6735* (2025.01); *H10D 62/121* (2025.01); *H10P 50/71* (2026.01); *H10P 76/405* (2026.01)

(58) Field of Classification Search

CPC ... H10D 30/6735; H10D 30/014; H10D 84/83

See application file for complete search history.

(56) References Cited

U.S. PATENT DOCUMENTS

| | | | | |
|---|---|---|---|---|
| 2021/0398977 | A1* | 12/2021 | Mishra ................ | H10D 84/853 |
| 2022/0045051 | A1 | 2/2022 | You et al. | |
| 2022/0359265 | A1 | 11/2022 | Chang et al. | |
| 2024/0203990 | A1* | 6/2024 | Xie ...................... | H10D 30/014 |

OTHER PUBLICATIONS

Extended European Search Report from European Patent Application No. 23214822.1 notified Oct. 16, 2024, 13 pgs.

* cited by examiner

*Primary Examiner* — Matthew L Reames

(74) *Attorney, Agent, or Firm* — Essential Patents Group, LLP

(57) ABSTRACT

Transistor structures comprising a gate electrode, or “gate,” that is self-aligned to underlying channel material. A mask material employed for patterning the channel material is further employed to define a cap of mask material having a larger width that protects a portion of gate material during a gate etch. The cap is therefore self-aligned to the channel material so that an amount by which a gate material extends laterally beyond the channel material is ensured to be symmetrical about a centerline of the channel material.

10 Claims, 12 Drawing Sheets

TRANSISTOR WITH CHANNEL-SYMMETRIC GATE

BACKGROUND

For advanced integrated circuits, the performance of a transistor is dependent, in part, on parasitic capacitance. In dense transistor arrays, one source of parasitic capacitance stems from coupling between gate electrodes, or "gates" of adjacent transistors. The gate coupling capacitance is a function of spacing between adjacent gates and can be reduced by increasing the spacing.

Spacing between the gates of adjacent transistors is advantageously maximized for a given lateral transistor channel pitch. However, conventional manufacturing techniques define transistor channel pitch with a first lithographic mask and define gate spacing with a second lithographic mask. Accordingly, transistor channel pitch and/or gate coupling capacitance must accommodate non-zero misregistration between these two masks.

Transistor architectures that could reduce or eliminate the misregistration between gates and transistor channels would therefore be commercially advantageous for reducing parasitic capacitance and/or transistor pitch of a given CMOS integrated circuit (IC).

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
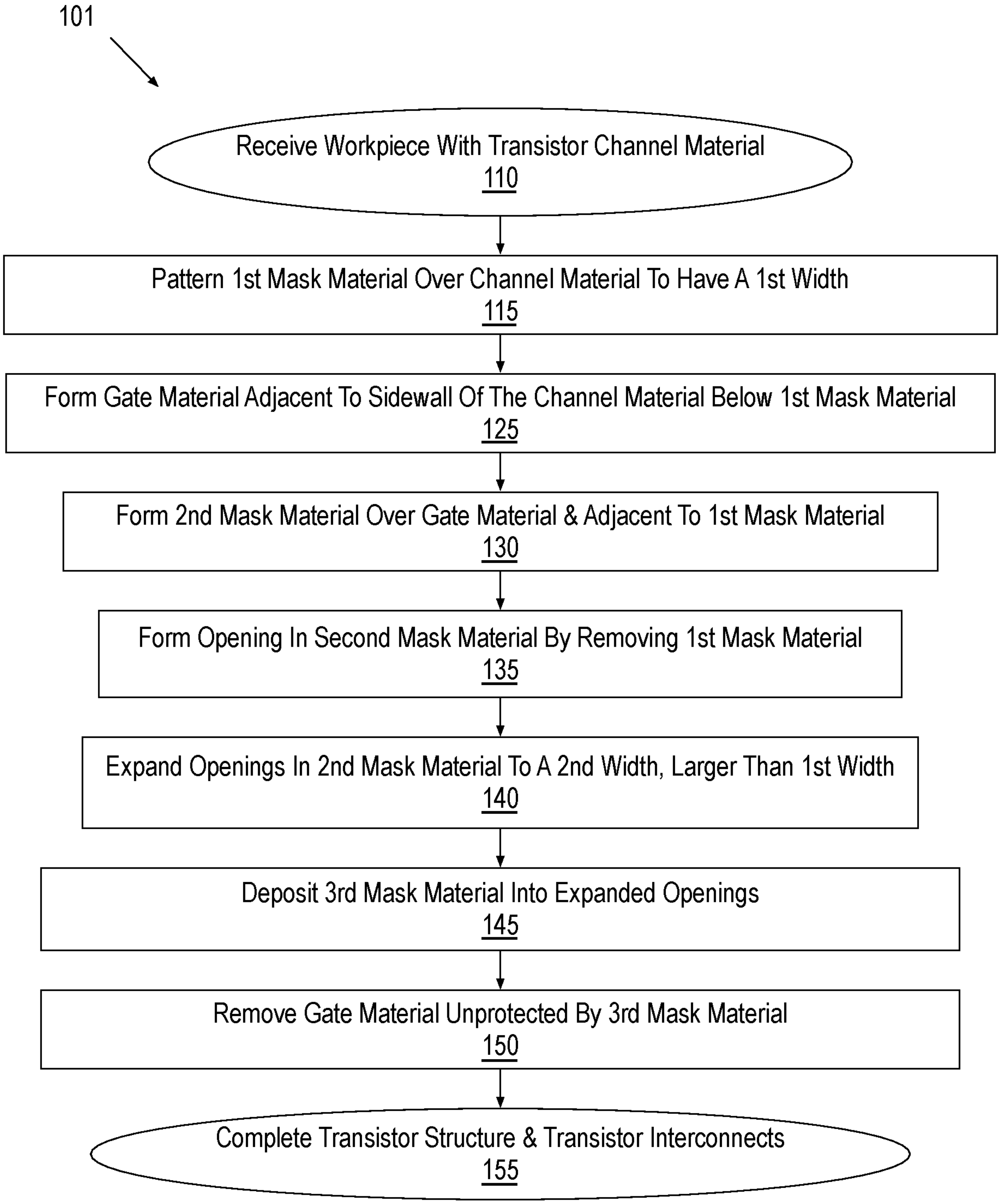
FIG. 1A is a flow diagram illustrating self-aligned fabrication of a transistor structure having a channel-symmetric gate, in accordance with some embodiments.

Embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms “over,” “under,” “between,” and “on” as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer “on” a second material or layer is in direct contact with that second material/layer. Similar distinctions are to be made in the context of component assemblies.

As used throughout this description, and in the claims, a list of items joined by the term “at least one of” or “one or more of” can mean any combination of the listed terms. For example, the phrase “at least one of A, B or C” can mean A; B; C; A and B; A and C; B and C; or A, B and C.

Unless otherwise specified in the specific context of use, the term “predominantly” means more than 50%, or more than half. For example, a composition that is predominantly a first constituent means more than half of the composition is the first constituent (e.g., <50 at. %). The term “primarily” means the most, or greatest, part. For example, a composition that is primarily a first constituent means the composition has more of the first constituent than any other constituent. A composition that is primarily first and second constituents means the composition has more of the first and second constituents than any other constituent. The term “substantially” means there is only incidental variation. For example, composition that is substantially a first constituent means the composition may further include <1% of any other constituent. A composition that is substantially first and second constituents means the composition may further include <1% of any constituent substituted for either the first or second constituent.

In accordance with embodiments herein, integrated circuitry includes a transistor structure comprising a gate electrode, or “gate,” that is self-aligned to underlying channel material. FIG. 1A is a flow diagram illustrating methods 101 for fabricating a transistor structure having channel-symmetric gate material that is self-aligned to channel material, in accordance with some embodiments. Methods 101 begin at input 110 with receipt of a workpiece including transistor channel material. At block 115, the channel material is made non-planar (e.g., into a “fin”) according to a first lithographic patterning process. A first mask material over the channel material is patterned concurrently with the channel material to have a lateral width in a first dimension.

At block 125, gate material is formed adjacent to a sidewall of the channel material and recessed below the first mask material. At block 130, a second mask material is formed over the gate material and adjacent to the first mask material. At block 135, an opening is formed in the second mask material by removing the first mask material. This opening is therefore self-aligned to the underlying channel material. At block 140, the opening is laterally expanded to a second width in the first direction, for example by recessing sidewalls of the second mask material with an etch process.

At block 145, a third mask material is deposited into the enlarged opening so that the third mask material has the second width and remains self-aligned to the underlying channel material. At block 150, gate material unprotected by the third mask material may then be removed, for example with any suitable etch process(es) that removes the second mask material and underlying gate material. Methods 101 end at output 170 where the transistor structure and/or transistor interconnects (i.e., metallization lines and vias) may be completed according to any integrate circuit fabrication techniques known in the art.

In methods 101, the enlarged third mask material may function as a protective cap self-aligned to the channel material so that an amount by which a gate material extends laterally beyond the channel material is ensured to be symmetrical about a centerline of the channel material. Accordingly, gate material may be more precisely controlled to have a minimal amount of overlap beyond the channel material without risk of inadvertently exposing one side of the channel material, for example because of misalignment between multiple lithographic patterning processes. With methods 101 providing minimal gate end overlap, end-to-end spacing of adjacent gate material may be maximized for a given transistor pitch, thereby achieving a reduction in parasitic capacitance.

Figure 1B:
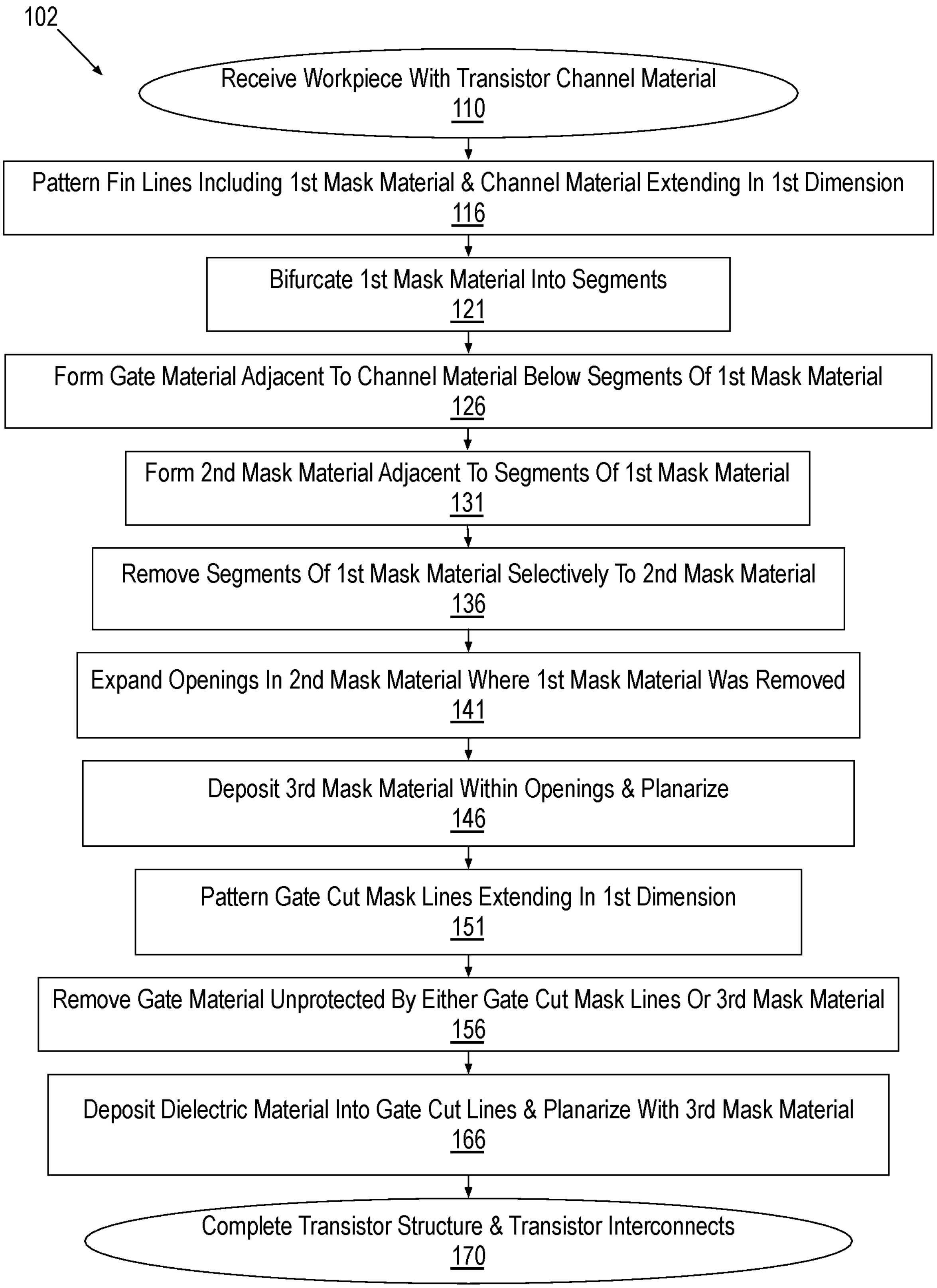
FIG. 1B is a flow diagram illustrating methods for forming a transistor structure having a channel-symmetric gate material that is self-aligned to transistor channel material, in accordance with some further embodiments

FIG. 1B is a flow diagram illustrating methods 102 for forming a transistor structure having a channel-symmetric gate material that is self-aligned to transistor channel material, in accordance with some further embodiments. Methods 102 illustrate some specific implementations of methods 101 although other implementations of methods 101 are also possible. While methods 102 further illustrate many advantages of methods 101, not all aspects of methods 102 need be practiced in all implementations of methods 101. FIG. 2-12A are isometric views of transistor structures evolving as the methods 102 are practiced, in accordance with some embodiments. The depicted transistor structures further highlight structural features associated with an exemplary practice of methods 102. However, the practice of methods 102 need not result in all the structures exactly as illustrated in FIG. 2-12A.

Referring first to FIG. 1B, methods 102 again begin at input 110 with receipt of a workpiece including transistor channel material. In some examples, the workpiece received at input 110 comprise a 300-450 mm diameter wafer. The workpiece may include a substantially monocrystalline material and any number of channel material layers over the monocrystalline material. The workpiece further includes a mask material over the channel material layer(s). In the example illustrated in FIG. 2, a workpiece portion 201 comprises a mask material 215 over a transistor channel material stack 210 that further includes a plurality of bilayers. Each bilayer comprising a sacrificial material 211 and a channel material 212. The number of bi-layers may vary with implementation.

Channel material 212 may have any composition suitable for a channel of a field effect transistor (FET). In some examples, channel material 212 is substantially silicon. In other embodiments, channel material 212 comprises germanium (e.g., $Si_{1-x}Ge_X$, $Ge_{1-x}Sn_X$, or substantially pure Ge). In some embodiments, channel material 212 includes a transition metal and a chalcogen. The transition metal may be any transition metal such as any element of groups 4 through 11, the group 3 elements scandium and yttrium, and the inner transition metals (e.g., f-block lanthanide and actinide series). Notable transition metals are molybdenum and tungsten. The chalcogen may be sulfur, selenium, and tellurium. In still other embodiments, channel material 212 comprises one or more metals and oxygen (i.e., metal oxide semiconductor), such as, but not limited to, Indium, gallium zinc oxide (IGZO).

Channel material 212 is advantageously crystalline. Although the crystalline semiconductor includes polycrystalline thin film material, channel material 212 may be substantially monocrystalline. In some embodiments where channel material 212 is substantially pure silicon, the crystallinity of channel material 212 is cubic with a top surface having crystallographic orientation of (100), (111), or (110), for example. Other crystallographic orientations are also possible. Channel material 212 may also be polycrystalline or amorphous, for example in certain metal chalcogen and/or metal oxide embodiments.

Sacrificial material 211 has a different composition than channel material 212. In some examples, sacrificial material 211 has more germanium than channel material 212. For example, where channel material 212 is predominantly silicon, sacrificial material 211 is $Si_{1-X}Ge_X$, and X may be advantageously between 0.3-0.35. In other embodiments, sacrificial material 211 has less germanium than channel material 212. For example, where the channel material 212 is $Si_{1-X}Ge_X$, sacrificial material 211 may be predominantly silicon. In other embodiments where channel material 212 is a first metal chalcogenide, sacrificial material 211 may be a second metal chalcogenide or a metal oxide, for example.

Figure 2:
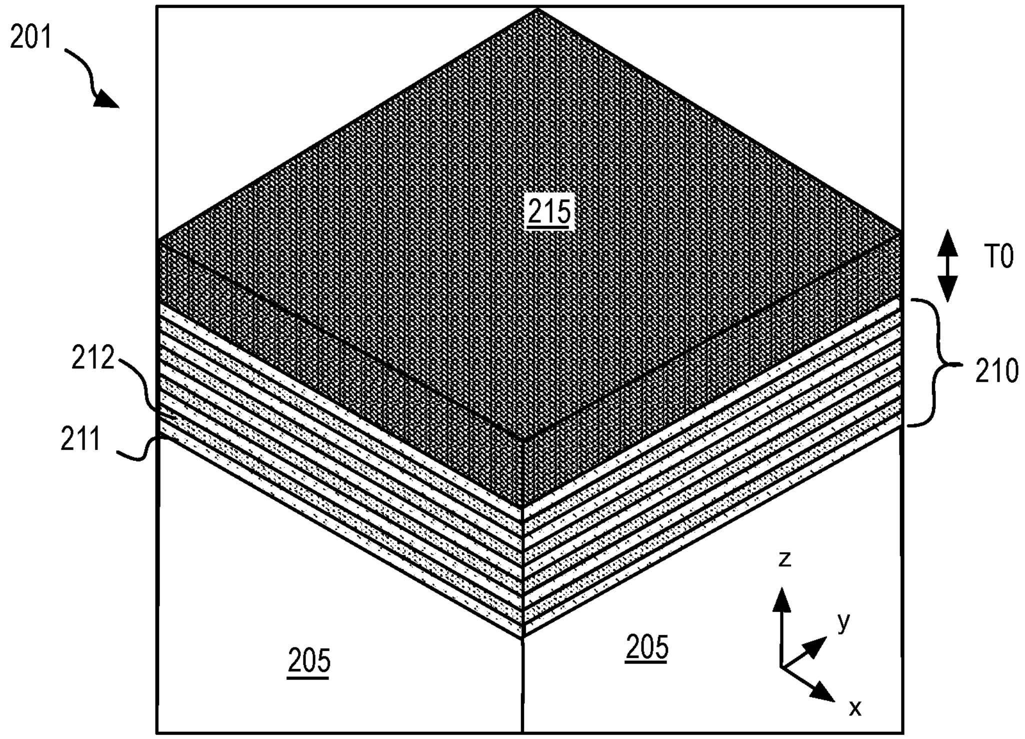
FIGS. 2, 3, 4, 5, 6, 7, 8, 9, 10, 11, and 12A are isometric views of transistor structures evolving as the methods illustrated in FIG. 1B are practiced, in accordance with some embodiments.
Figure 3:
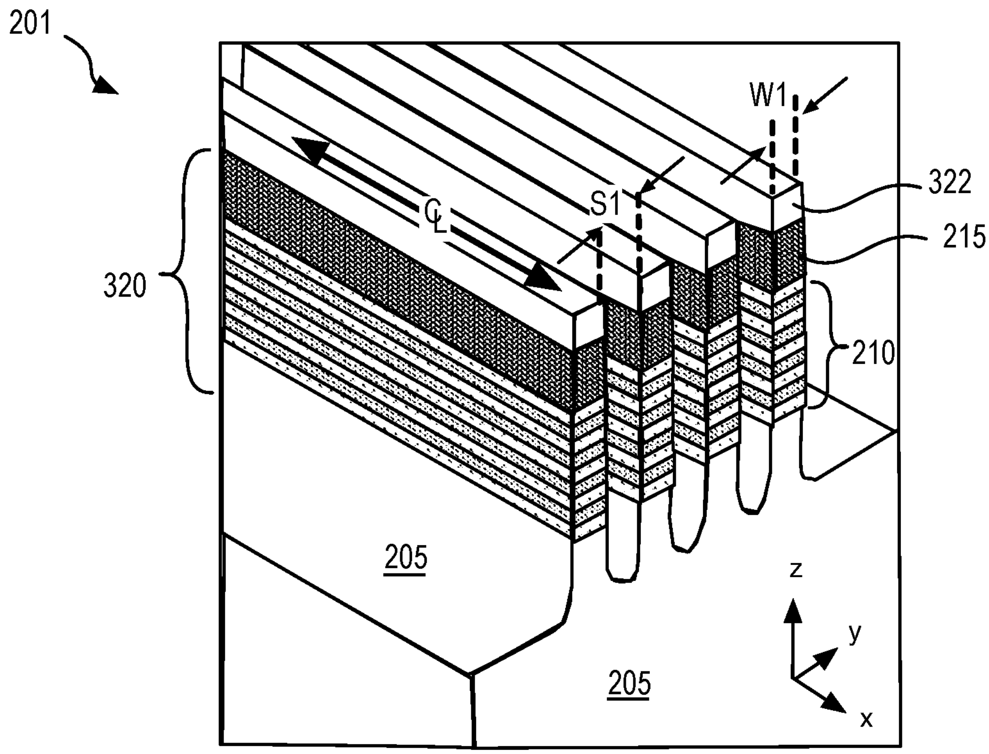
Figure 4:
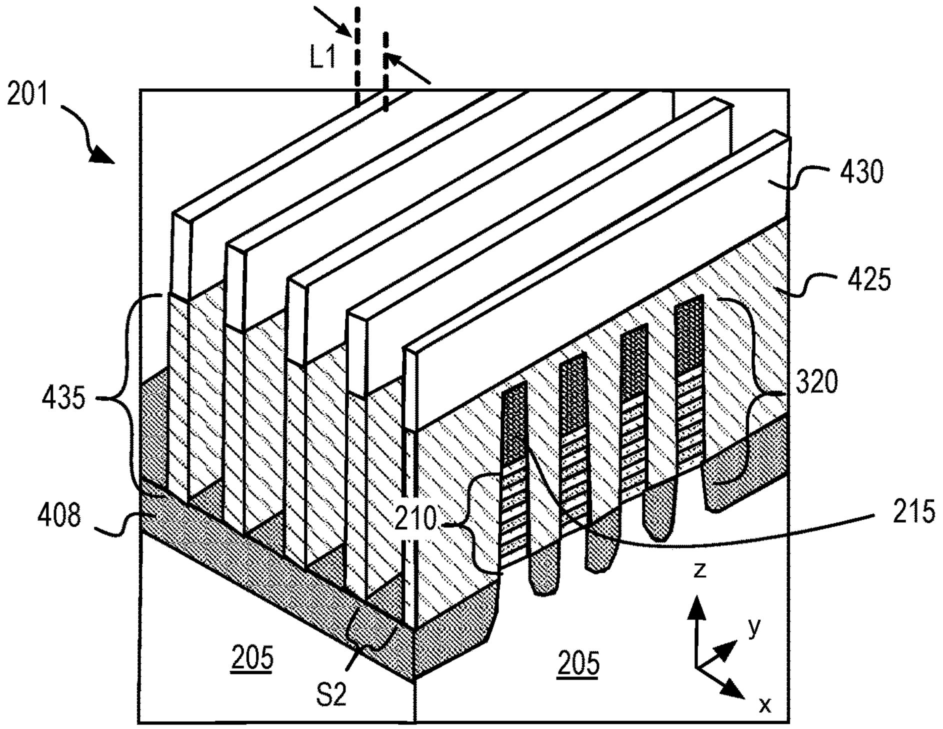

Mask material 215 may have any composition known to be suitable as a hardmask for patterning channel material stack 210. In some examples, mask material 215 is a dielectric material, such as, but not limited to silicon oxide (SiO), silicon nitride (S/N), silicon oxynitride, (SiON). Although only one layer is illustrated in FIG. 2, mask material 215 may comprise one or more material layers having a total thickness TO. Thickness TO may vary with implementation, but in some examples is within the range of 20-60 nm.

Returning to FIG. 1B, methods 102 continue at block 116 where fin lines are patterned into the channel material layers(s) and into any overlying mask material layer(s). The fin lines may extend any length along a first dimension and have a width in a second, orthogonal dimension. Any lithographic masking process and material etch process(es) may be practiced at block 116. In the example illustrated in FIG. 3, lines 320 have been patterned into workpiece portion 201. Each line 320 comprises channel material stack 210 and mask material 215. Each line 320 may also comprise a sub-fin portion of underlying substrate material 205. Lines 320 are substantially parallel and extend laterally a longitudinal length in the x-dimension. An arrow demarks a centerline ($C_L$) of one line 320 that is coincident with an x-axis. A lithographic mask 322 defined lines 320 to have a first lateral width W1 coincident with the y-axis (i.e., orthogonal to the direction of the longitudinal centerline). Laterally adjacent fin lines 320 are separated by a space S1. Line width W1 and space S1 define an y-dimensional pitch of lines 320.

Returning to FIG. 1B, methods 102 continue at block 121 where the line mask material is bifurcated into segments with each segment located over a transistor channel region. This bifurcation may be with a second lithographic patterning process defining lines that are substantially orthogonal to the fin lines. In the example shown in FIG. 4, workpiece portion 201 now includes an isolation material 408 between fin lines 320. Any suitable gate mandrel material 425 is deposited over the fin lines 320 and patterned into gate mandrel lines 435 according to a photolithographically patterned mask 430. As shown, gate mandrel lines 435 are substantially parallel and extend laterally over a longitudinal length coincident with the y-axis. Each gate mandrel line 435 has a transverse length L1 that is over an underlying segment of mask material 215 and, below that, a length of channel material stack 210. Between adjacent gate mandrel lines 435 is a space S2. With each gate mandrel line 435 protecting underlying channel material, source and drain material (not depicted) may be formed within spaces S2 to couple with ends of each transistor channel region. Any technique(s) may be practiced to form source and drain regions, for example comprising a high concentration of impurities that impart either p-type or n-type conductivity.

Figure 5:
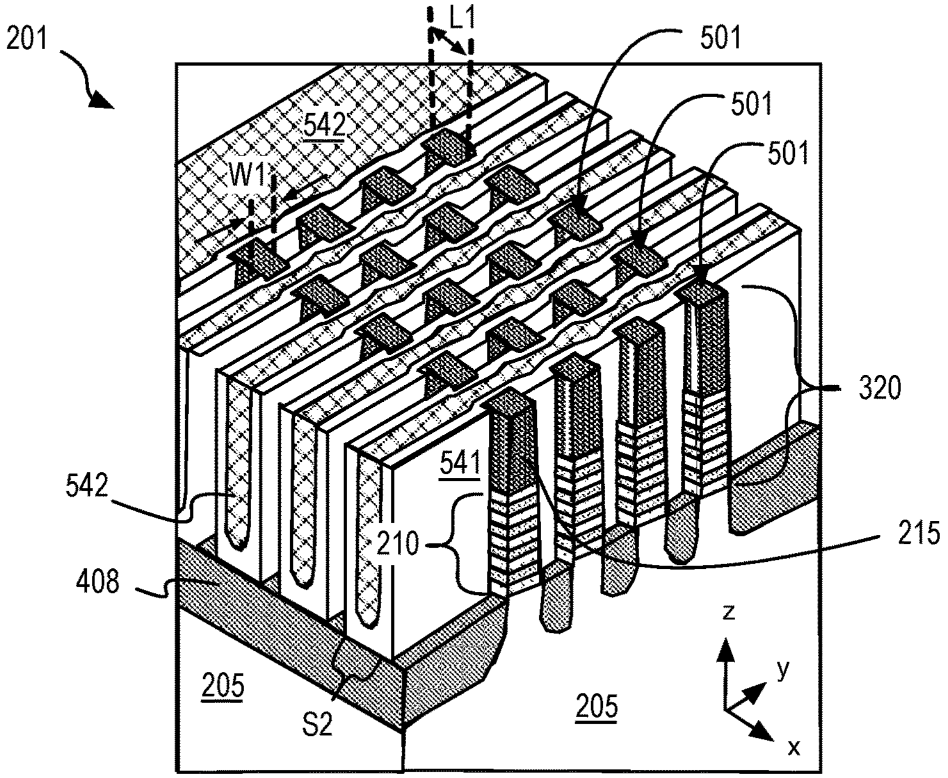

As further illustrated in FIG. 5, spaces S2 have been backfilled with a gate spacer comprising one or more spacer materials 541 and 542. Spacer materials 541, 542 may be deposited by any process and then planarized with a top surface of mask material 215 and/or gate mandrel material 425. Although a gate spacer may have any composition, in exemplary embodiments spacer materials 541 and 542 are both dielectrics. Advantageously, spacer material 541 and/or 542 has a different chemical composition than that of mask material 215. Spacer material 541 and/or 542 may also have a different composition than the gate mandrel lines so that the gate mandrel lines may be removed selectively to spacer material 541 and/or 542. As illustrated in FIG. 5, removal of the gate mandrel lines exposes mask material segments 501 of mask material 215. Below each mask material segment 501 is channel material 212. Each mask material segment 501 has the length L1 and the width W1.

Methods 102 (FIG. 1B) continue at block 126 where gate material is formed adjacent to the channel material. Any suitable gate material(s) may be formed over one or more surfaces of the channel material. In advantageous embodiments, gate material is formed at least adjacent to a sidewall of channel material. Gate material may be formed over any gate insulator suitable for the channel material composition. Gate material may also have any composition suitable for the channel material composition, for example to achieve a desired transistor threshold voltage, etc.

Figure 6:
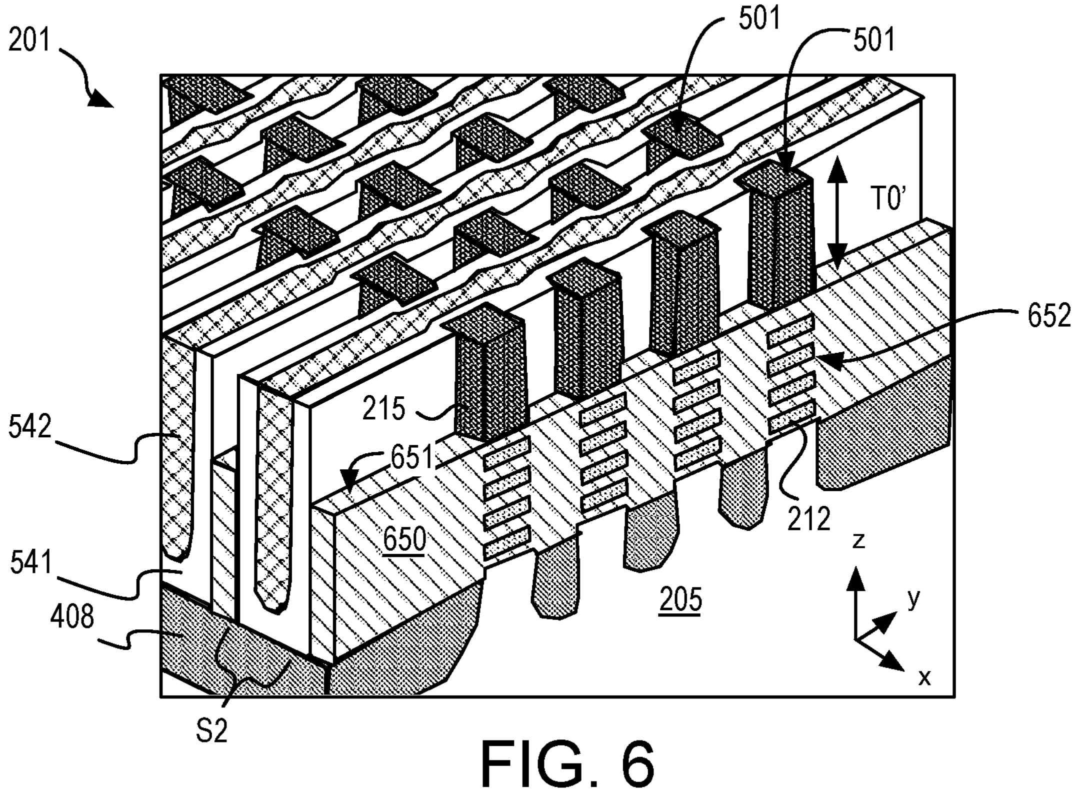
Figure 7:
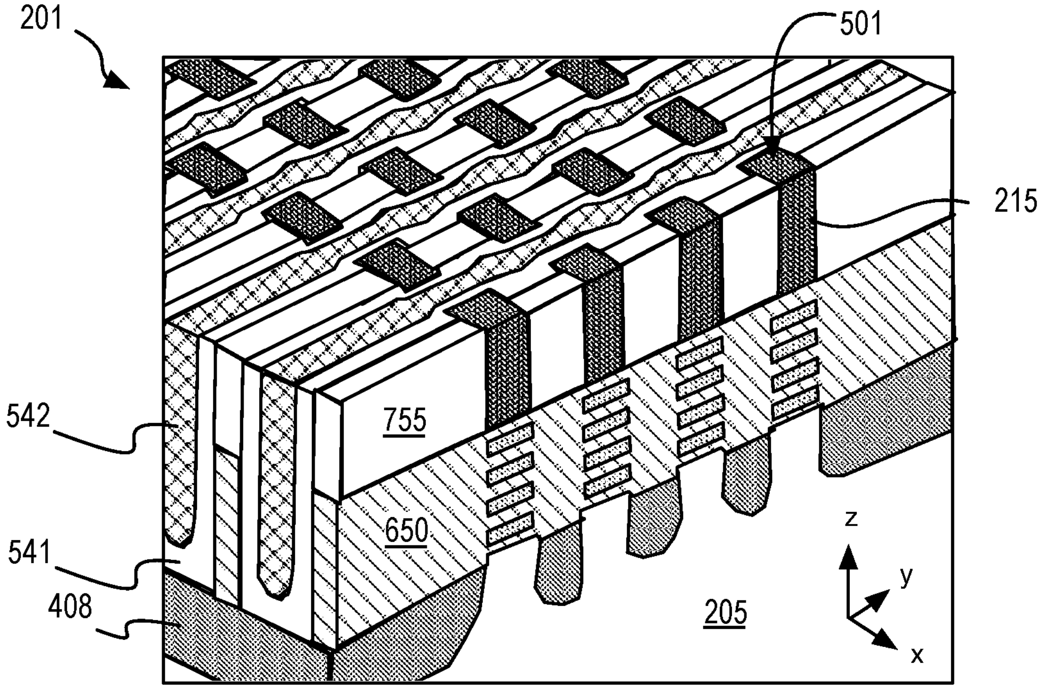

In the example illustrated in FIG. 6, gate material 650 is occupying a region between adjacent spacer material 541. As shown, gate material 650 backfills channel regions where sacrificial material has been removed from between layers of channel material 212. Any gate insulator material 652, such as a high-k (e.g., >9) dielectric including oxygen and silicon or one or more metals, may be between channel material 212 and gate material 650. Gate material 650 may be deposited to be essentially where the gate mandrel material was previously removed. Gate material 650 may have any composition, for example comprising platinum, nickel, molybdenum, tungsten, titanium, nitrides such as titanium nitride, or tungsten silicon nitride, or the like. In some embodiments, gate material 650 includes a work function metal and a fill metal. Gate material 650 may be deposited and planarized with a surface of mask material 215 and/or spacer materials 541, 542. Following planarization, a gate material top surface 651 may be recessed with any suitable gate etch process to expose sidewalls of mask material 215. Advantageously, the gate recess etch is selective to gate material 650, ensuring mask material 215 and spacer material(s) 541, 542 are adequately retained. The recess etch of gate material 650 may expose any thickness TO' of mask material 215.

With an initial lateral width W0 of mask material segments 501 defining the channel material width as a function of the fin line patterning process, methods 102 (FIG. 1B) continue with blocks 131-146 perfecting a mask polarity switch that facilitates laterally expanding the width of the mask material segments 501. By practicing these operations, the mask expansion retains symmetry of the mask material about the centerline of the channel region.

At block 131, a second mask material is formed laterally adjacent to the first mask material. This second mask material is deposited upon the underlying gate material and is then planarized with the first mask material and/or surrounding gate spacer. The mask material deposited at block 131 advantageously has a chemical composition distinct from the first mask material facilitating a subsequent removal of the first mask material selective of the second mask material. In the example illustrated in FIG. 7, mask material 755 occupies the region from where gate material 650 was recessed. Mask material 755 may be deposited according to any technique and subsequently planarized with a top surface of mask material 215 and/or spacer materials 541, 542. For exemplary embodiments where mask material 215 has a first composition (e.g., comprising at least silicon and nitrogen), mask material 755 has a second composition (e.g., comprising more carbon, more oxygen, less silicon, or less nitrogen than mask material 215). As one example, mask material 755 may be amorphous carbon (α-carbon).

Returning to FIG. 1B, methods 102 continue at block 136 where the first mask material is removed. Because the second mask material has a different composition than the first mask material, the first mask material can be removed selectively to the second mask material (e.g., with any chemical etch process suitable for the composition of the first mask material). The etch performed at block 136 may also remove one or more of residual gate insulator material, residual spacer material, residual isolation material, or any other residual thin film material that may have collected at the interface between adjacent sidewalls of the first and second mask materials. Block 136 therefore completes a polarity change of the channel region mask, leaving an opening over only the channel region of a transistor with a self-aligned mask material adjacent to the opening.

Figure 8:
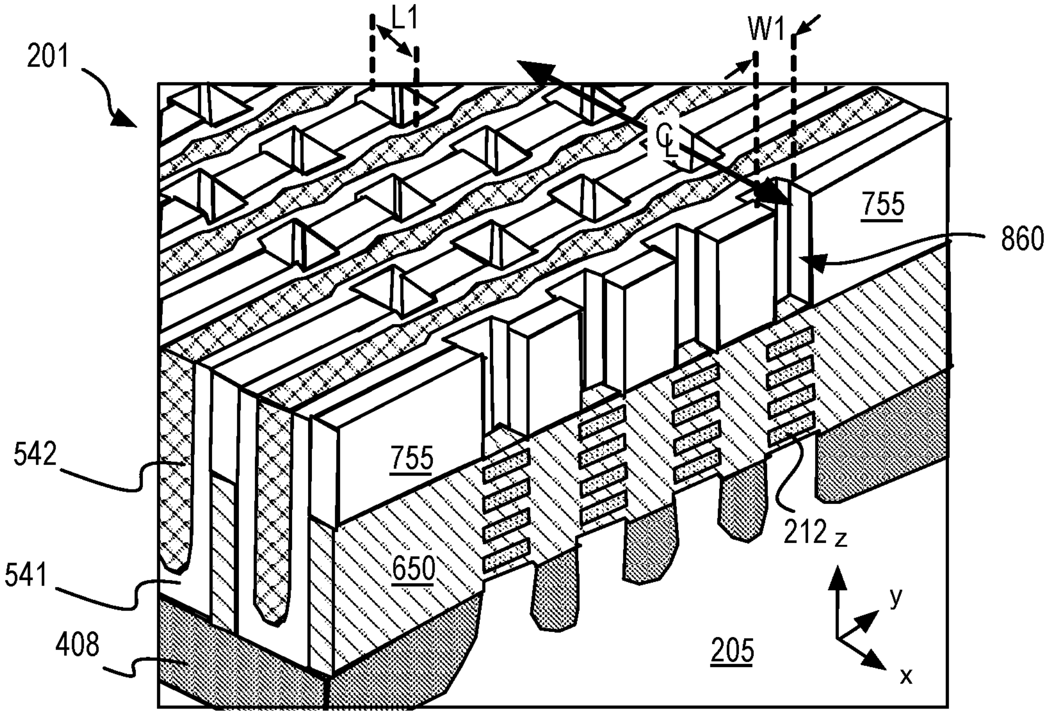

In the example illustrated in FIG. 8, workpiece portion 201 now comprises openings 860 where mask material 215 has been etched away selectively to mask material 755. As shown, openings 860 have the same lateral dimensions (e.g., width W1 and length L1) that were previously defined for a mask material segment. Openings 860 are also similarly co-linear along a centerline ($C_L$) demarked by an arrow, which in the illustrated example is coincident with the x-axis. Openings 860 are symmetrical about the depicted centerline ($C_L$) of channel material 212.

Returning to FIG. 1B, methods 102 continue at block 141 where the openings formed by removing the first mask material are laterally expanded from their initial width to some larger width by eroding the second mask material. This lateral expansion may comprise an etch along at least a portion of a sidewall of the opening proximal to the second mask material. The etch performed at block 141 may remove one or more of residual gate insulator material, residual spacer material, residual isolation material, or any other residual thin film material that may have collected as a lining on a sidewall of the first mask material prior to deposition of the second mask material.

Figure 9:
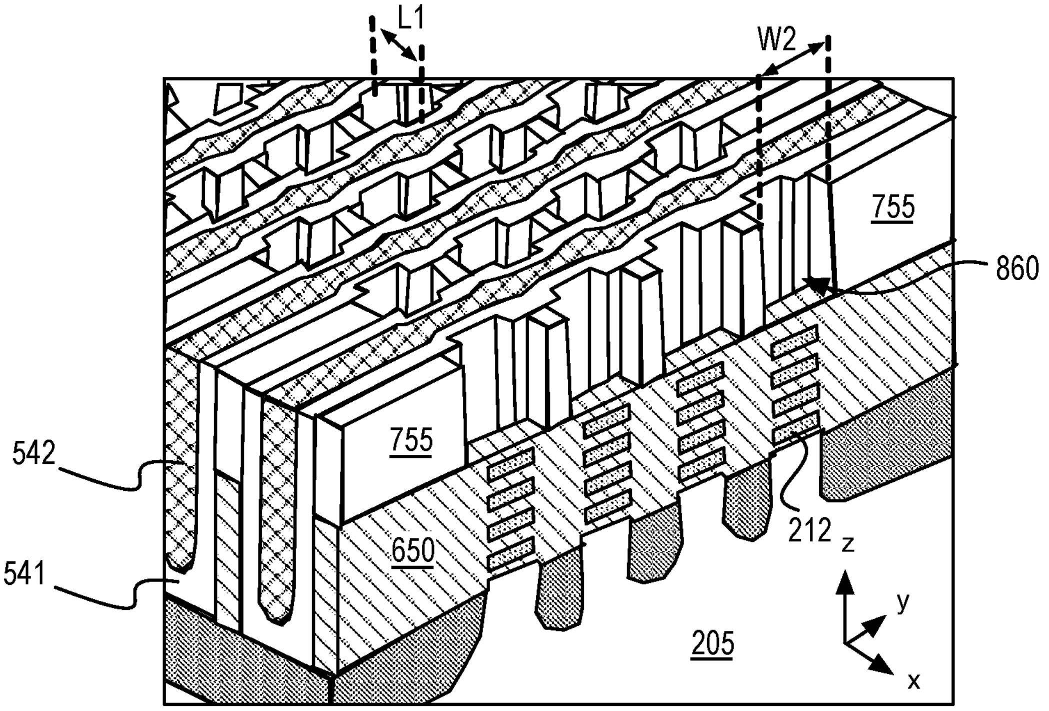

In some embodiments, for example, as illustrated in FIG. 9, mask material 755 is exposed and etched either isotropically or with an angled (sloped) directional ion etch that can be controlled to recess a sidewall of mask material 755 by equal amounts on opposite sides of a centerline length L1 through opening 860 to reach a desired width W2, which is larger in the y-dimension than width W1 (FIG. 8). With the increased width W2 remains centered about a centerline of opening 860 aligned with the x-dimension. Opening 860 remains self-aligned to the underlying channel material 212. As further shown in FIG. 9, the etchback of mask material 755 is selective to spacer materials 541, 542 such that opening 860 remains of length L1.

Returning to FIG. 1B, methods 102 continue at block 146 where another (i.e., third) mask material is deposited into the enlarged opening. Following deposition, the third mask material may again be planarized with a top surface of the surrounding materials. The mask material deposited at block 146 is advantageously has a different composition than the mask material deposited at block 131. The mask material deposited at block 146 is advantageously of a composition that will be resistant to a subsequent etch of the underlying gate material. The mask material deposited at block 146 may be of substantially the same composition as the mask material previously removed to form the opening within which the mask material was deposited. Alternatively, the mask material deposited at block 146 may be of a different composition than the initial mask material employed during a fin line etch.

Figure 10:
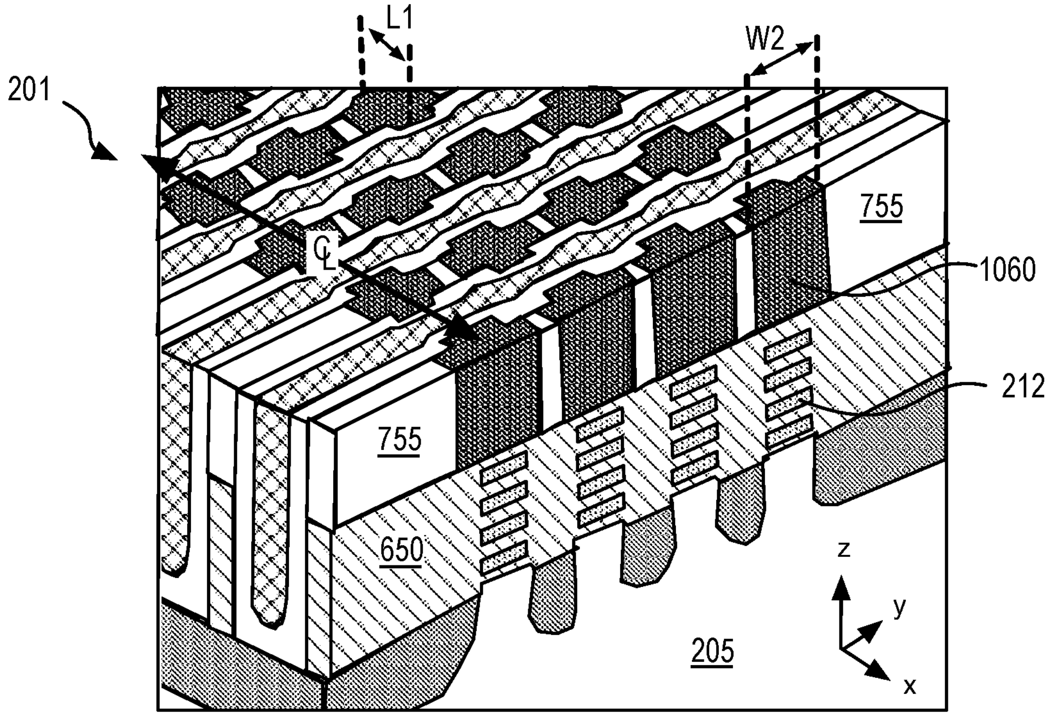

In the example illustrated in FIG. 10, mask material 1060 has been deposited into the openings adjacent to mask material 755. As shown, each cap of mask material 1060 is aligned along the original fin centerline demarked by an arrow coincident with the x-axis. Each cap of mask material 1060 has a length of approximately L1 and has the width W2, which is symmetrical and/or centered about the fin centerline ($C_L$). Gate material 650 and channel material 212 are under mask material 1060.

With gate material protected by a cap of mask material having a self-aligned expanded width, the cap may be employed as an etch mask during a patterning process that defines a width of the gate material at block 151 (FIG. 1B). This "gate-cut" patterning process may, for example, pattern lines substantially parallel to the fin lines patterned at block 116. The patterning process at block 151 may entail any lithographic technique(s) and can be expected to have some non-zero misregistration relative to the patterning process performed at block 116.

Figure 11:
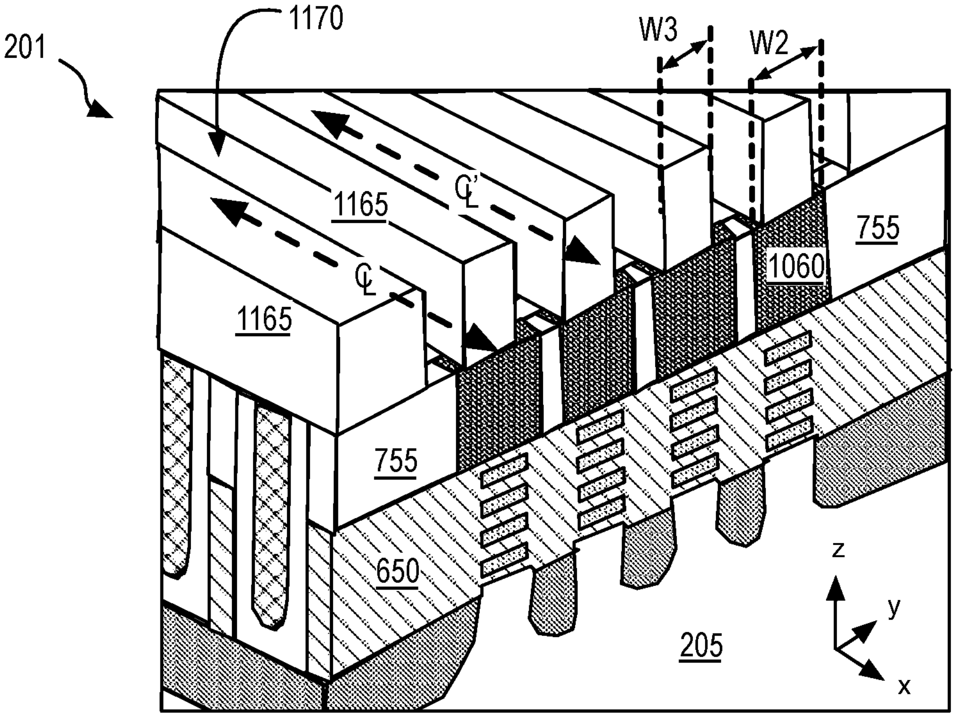

FIG. 11 illustrates workpiece portion 201 after patterning mask lines 1165. As shown, mask lines 1165 have a centerline ($C_L$'), which may be approximately aligned with fin line centerline ($C_L$), but have some non-zero misregistration ($C_L$-$C_L$'). In this example, each mask line 1165 overlapping mask material 1060 has a width W3 that is sufficient smaller than width W2 to ensure edges of mask material 1060 extend beyond edges of mask line 1165 so that a misregistration of mask lines 1165 does not impact the patterning of gate material 650 proximal to channel material 212.

Returning to FIG. 1B, methods 102 continue at block 155 where gate material not protected by either the mask material formed at block 146 or the mask material formed at block 151 is removed. The gate-cut pattern generated at block 156 is a summation of the polygons of mask material formed at block 146 and polygons defined lithographically at block 151. The mask pattern defined at block 151 may therefore overlap the mask material deposited at block 146, or not. Any etch process capable of removing gate material of a particular composition may be practiced at block 156.

Figure 12A:
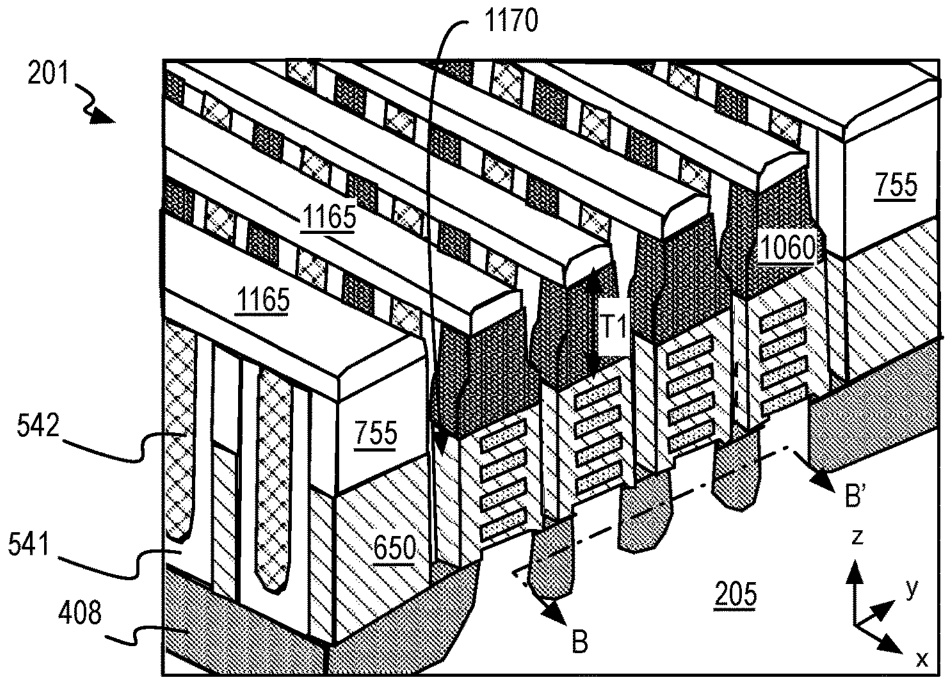

As further illustrated in FIG. 12A, gate cut trenches 1170 have been etched into workpiece portion 201. As shown, trenches 1170 are located within spaces between adjacent mask lines 1165 and are further limited by the presence of mask material 1060. Trenches 1170 extend through gate material 650, exposing isolation material 408, and may extend into and/or through isolation material 408 (e.g., into substrate material 205). In this example, trenches 1170 also extend through spacer materials 541, 542. The depicted shouldering or necking of mask material 1060 is indicative of incomplete consumption of the thickness of mask material 1060 during the gate cut/trench etch process, which ensures all gate material under mask material 1060 is protected from the etch process. Hence, mask material thickness TI may be selected to ensure mask material 1060 survives the gate cut etch process(es). The thickness TI may then be used to determine minimum thicknesses of the preceding mask materials from which mask material 1060 is derived.

Figure 12B:
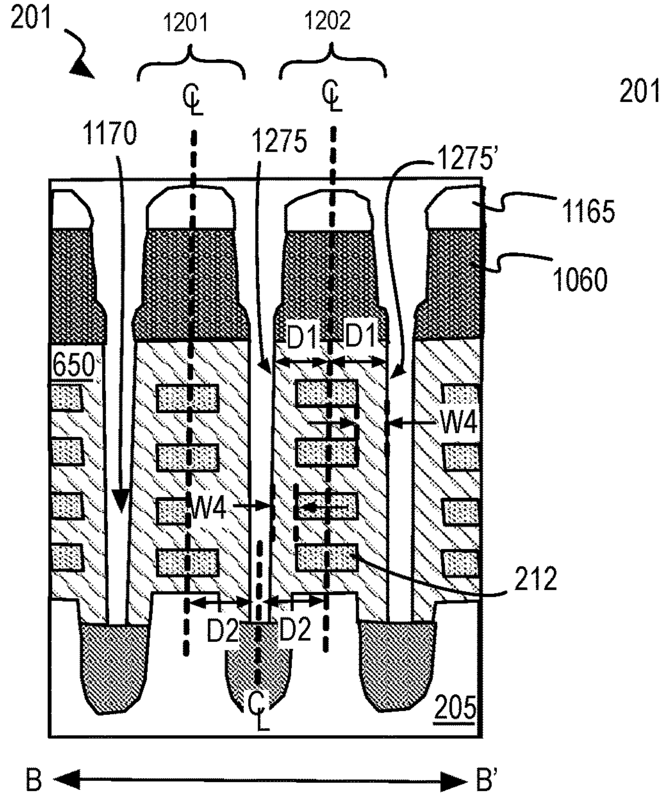
FIGS. 12B and 12C are cross-sectional views through a gate of the transistor structures shown in FIG. 12A, in accordance with some embodiments.

FIG. 12B is a cross-sectional view along the B-B' line illustrated in FIG. 12A. As shown in FIG. 12B, two adjacent transistor structures 1201 and 1202 are laterally separated by one trench 1170. Gate material 650 is centered about the centerline ($C_L$) of channel material 212 for each transistor structure 1201, 1202. Accordingly, gate material 650 has sidewalls 1275 and 1275' on opposite sides of the channel centerline that are spaced the same distance D1 from the channel centerline. A lateral gate overlap width W4 beyond an adjacent sidewall of channel material is therefore equal on both sides of the channel centerline within the y-z plane illustrated in FIG. 12A. Likewise, a centerline (CL) of trench 1170 is precisely spaced by distance D2 symmetrically between two adjacent transistor structures 1201, 1202. Accordingly, gate material end-to end spacing is equal to approximately twice distance D2, which is fin pitch in the y-dimension, minus twice distance D1.

With gate material 650 self-alignedly patterned to have a symmetrical gate overlap width W4, gate material sidewalls 1275 and 1275' may be laterally recessed, in accordance with some further embodiments. For example, as further illustrated in FIG. 12B, an etch process may be practiced to reduce the gate overlap width to W5. Gate material sidewalls 1275 and 1275' are then spaced the same distance D3 from the channel centerline and mask material 1060 overhangs gate material sidewalls 1275 and 1275' by a lateral distance D4 indicative of the gate material recess etch. Any isotropic or directional ion etch process may be practiced to trim the lateral width (e.g., y-dimension) of gate material 650 to be something smaller than width W2 of mask material 1060. Accordingly, gate material end-to end spacing becomes equal to approximately twice distance D2 minus twice distance D3, which has been reduced from distance D1 by the distance D4.

Figure 12C:
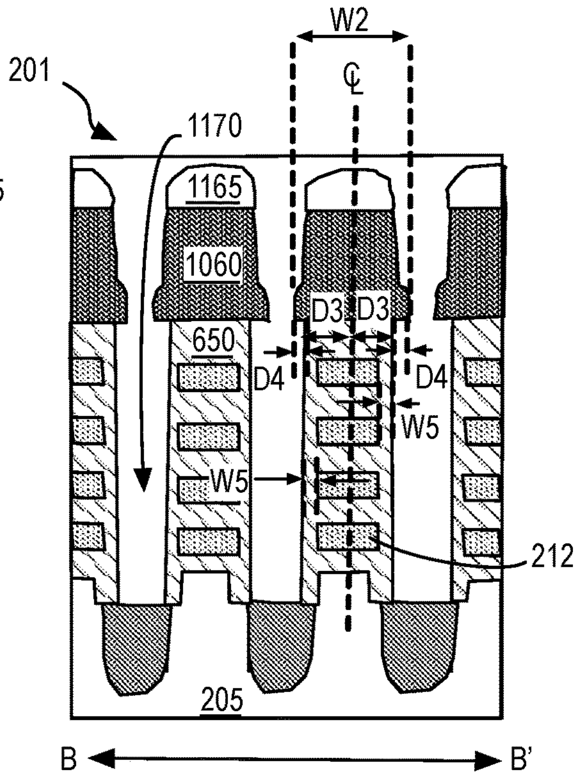
Figure 12D:
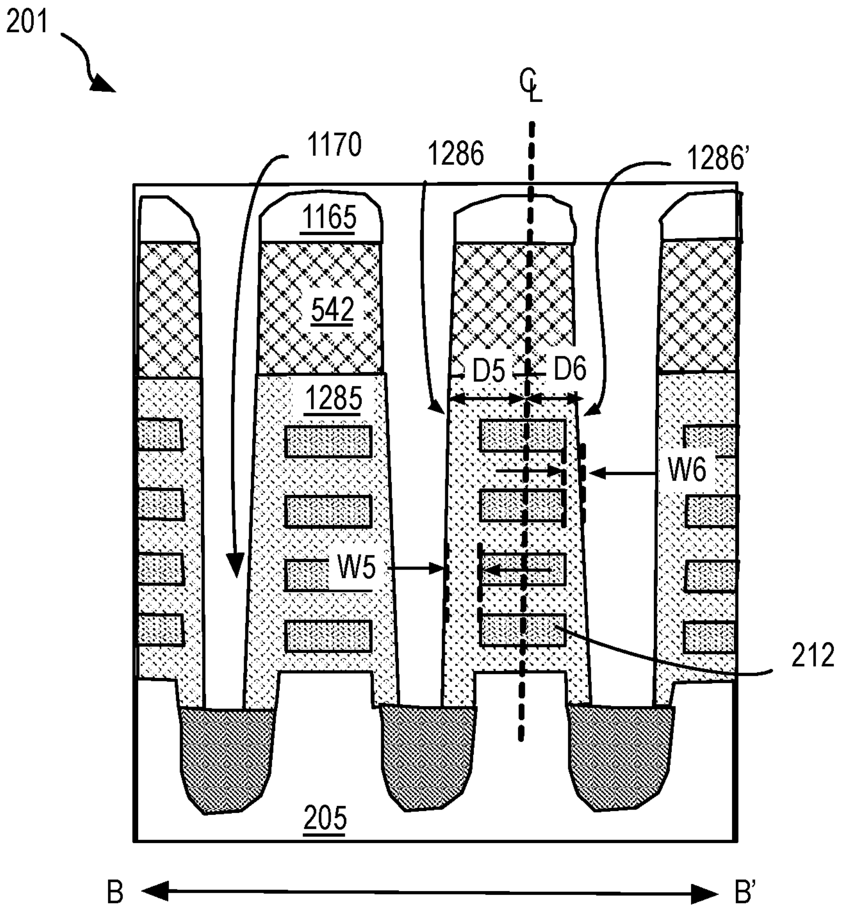
FIG. 12D is a cross-sectional view through a source or drain of the transistor structure in FIG. 12A, in accordance with some embodiments.

Notably, the self-aligned gate material illustrated in FIG. 12A-12C can be contrasted with transistor source and drain material, which may not be similarly self-aligned. For example, FIG. 12D illustrates a cross-sectional view again along the B-B' plane, but passing through source (drain) material 1285. As shown, spacer material 542 is over source (drain) material 1285. Trench 1170 pass through both spacer material 542 and source (drain) material 1285. Source (drain) material 1285 is therefore not self-aligned to a centerline ($C_L$) of channel material 212. In the illustrated example, one source (drain) material sidewall 1286 is a distance D5 from the channel material centerline while an opposing sidewall 1286' on the opposite side of the channel material centerline (within y-z plane) is a different distance D6 from the channel material centerline. In view of the difference in centering about the channel material centerline, overlap of source (drain) material is of differing widths W5 and W6. This difference may be a result of misalignment in the gate-cut mask, for example, and therefore the source (drain) cross-section in FIG. 12D serves as a useful reference to the gate cross-sections of FIG. 12A-12C. In exemplary embodiments, gate material is more symmetrical about a centerline of the channel material than source (drain) material.

Returning to FIG. 1B, methods 102 continue at block 166 where the trenches formed at block 156 may be at least partially backfilled, and advantageously planarized with the mask material retained over the gate material. Any dielectric material may be deposited at block 166, including SiO, SiN, SiON, or low-k dielectric material, etc. Methods 102 then end at output 170 where the transistor structures and/or transistor interconnects are completed, for example according to any known techniques.

Figure 13A:
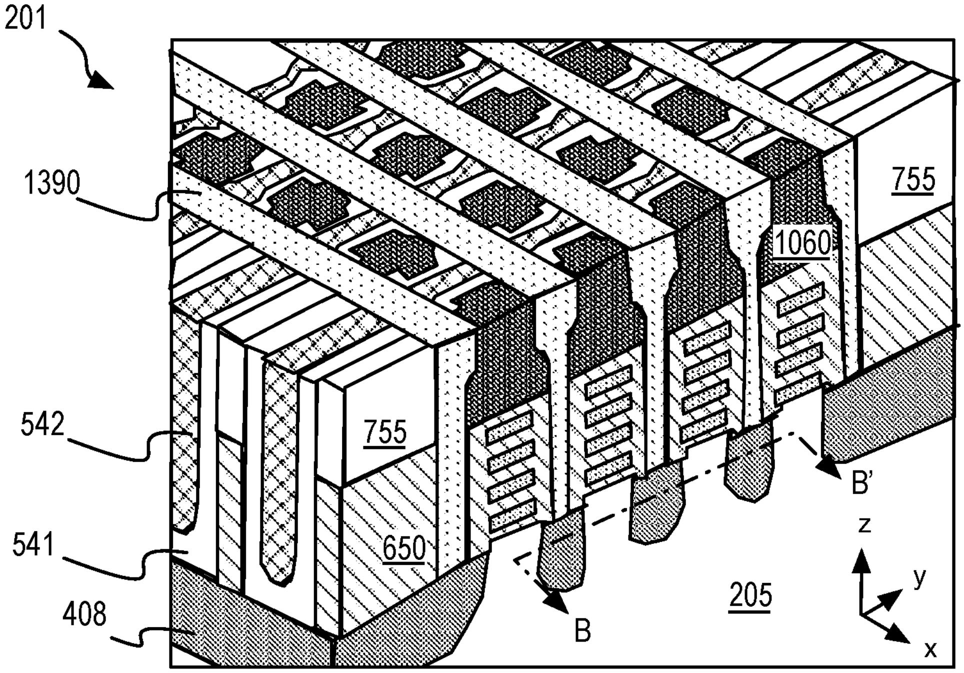
FIG. 13A is an isometric view of the transistor structure shown in FIG. 12A evolving as the methods illustrated in FIG. 1B are practiced, in accordance with some embodiments.
Figure 13B:
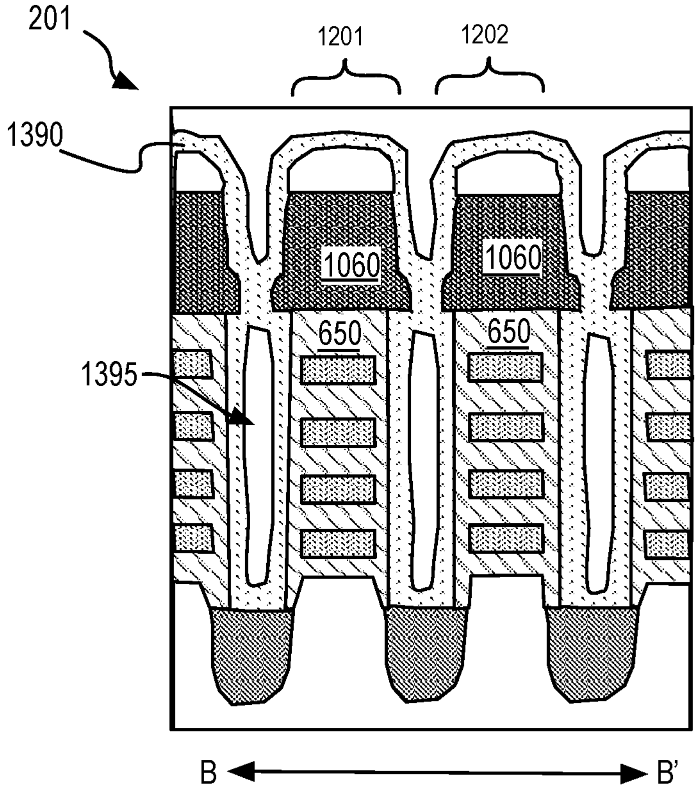
FIG. 13B is a cross-sectional view through a gate of the transistor structures shown in FIG. 13A, in accordance with some embodiments.

In the example illustrated in FIG. 13A, dielectric material 1390 has been deposited over workpiece portion 201 and then planarized with surrounding mask material 1060 and spacer materials 541, 542. Notably, the necked or shouldered profile of each cap of mask material 1060 within the y-z plane may be advantageously levered for air-gap isolation between gate material of adjacent transistor structures. In FIG. 13B, for example, gate material 650 of transistor structure 1201 is separated from gate material 650 of transistor structure 1202 by an air gap, space, or void 1395 where there is no dielectric material 1390. Such a structure may offer lower effective transistor capacitance than for structures where dielectric material 1390 completely fills the trench between two adjacent transistor structures. To form voids 1395, dielectric material 1390 may occlude the voids 1395 at a pinch point between adjacent caps of mask material 1060. Occlusion may be achieved with a substantially conformal deposition process, for example.

Figure 14:
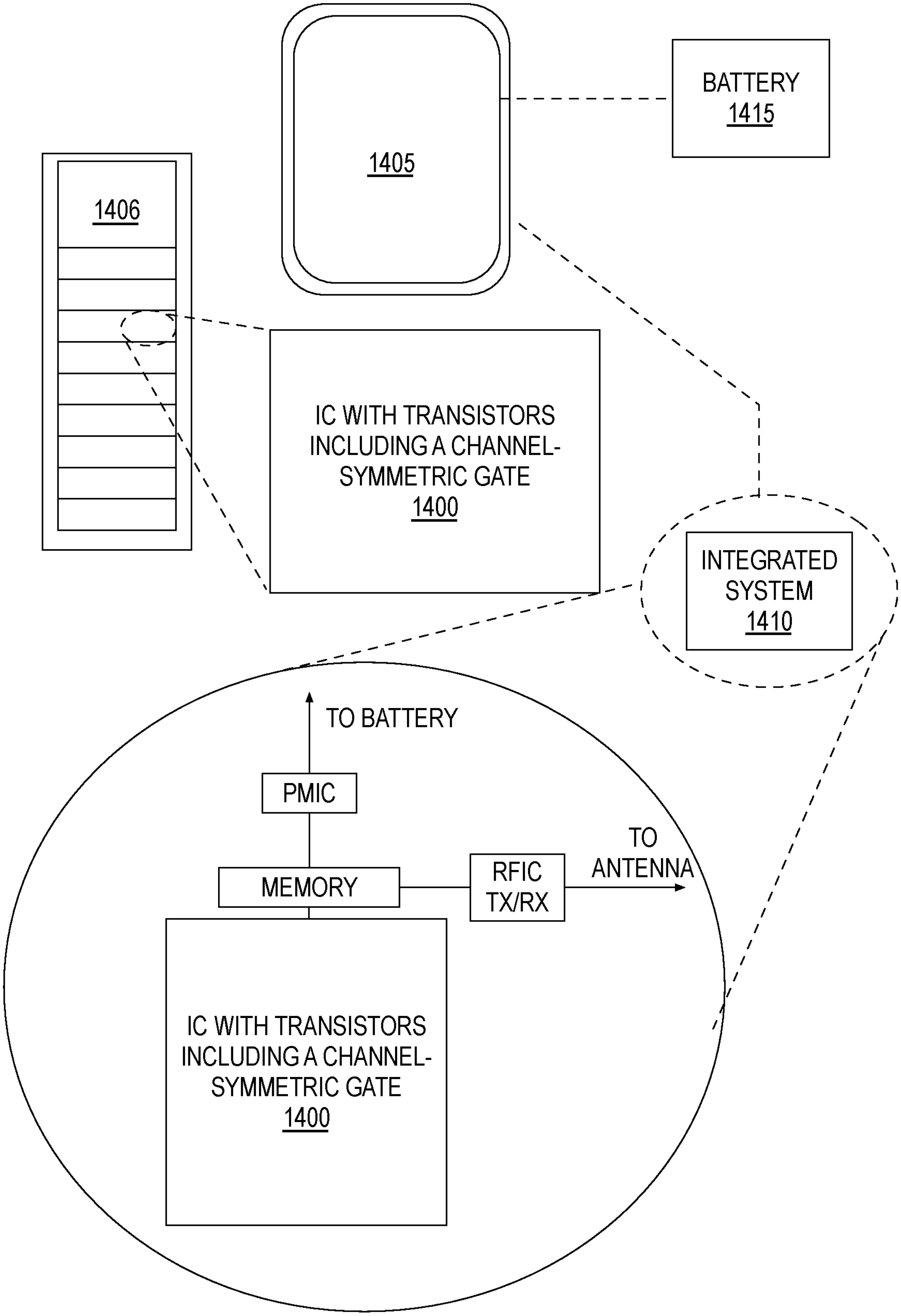
FIG. 14 illustrates a mobile computing platform and a data server machine employing an IC device with transistor structures that include a channel-symmetric gate, in accordance with some embodiments.

The transistor structures described above may be employed in a wide range of IC devices and further integrated in a wide range of computer-based applications. FIG. 14 illustrates a mobile computing platform 1405 and a server machine 1406 employing a packaged IC die including a channel-symmetric gate, for example as described elsewhere herein. Server machine 1406 may be any commercial server, for example including any number of high-performance computing platforms disposed within a rack and networked together for electronic data processing, which in the exemplary embodiment includes a packaged IC die comprising a fin-symmetrical gate, for example as described elsewhere herein.

The mobile computing platform 1405 may be any portable device configured for each of electronic data display, electronic data processing, wireless electronic data transmission, or the like. For example, the mobile computing platform 1405 may be any of a tablet, a smart phone, laptop computer, etc., and may include a display screen (e.g., a capacitive, inductive, resistive, or optical touchscreen), an integrated system 1410, and a battery 1415.

As illustrated in the expanded view, one or more of a power management integrated circuit (PMIC) or RF (wireless) integrated circuit (RFIC) including a wideband RF (wireless) transmitter and/or receiver may be further coupled to IC 1400. A PMIC may perform battery power regulation, DC-to-DC conversion, etc., and so has an input coupled to battery 1415 and an output providing a current supply to other functional modules. An RFIC may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G and beyond.

Figure 15:
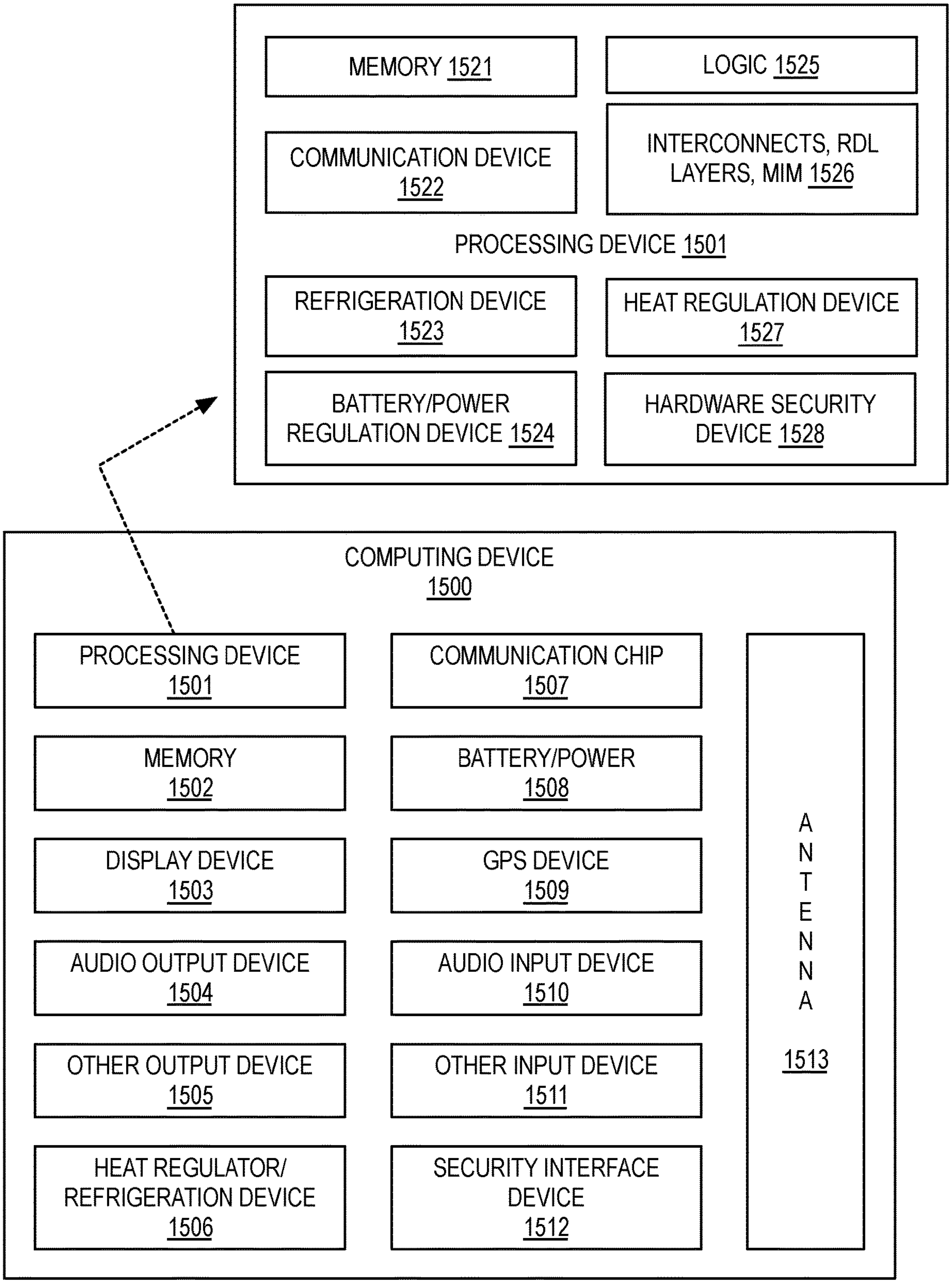
FIG. 15 is a functional block diagram of an electronic computing device, in accordance with some embodiments.

FIG. 15 is a block diagram of a cryogenically cooled computing device 1500 in accordance with some embodiments. For example, one or more components of computing device 1500 may include any of the channel-symmetric gate structures discussed elsewhere herein. A number of components are illustrated in FIG. 15 as included in computing device 1500, but any one or more of these components may be omitted or duplicated, as suitable for the application. In some embodiments, some or all of the components included in computing device 1500 may be attached to one or more printed circuit boards (e.g., a motherboard). In some embodiments, various ones of these components may be fabricated onto a single system-on-a-chip (SoC) die. Additionally, in various embodiments, computing device 1500 may not include one or more of the components illustrated in FIG. 15, but computing device 1500 may include interface circuitry for coupling to the one or more components. For example, computing device 1500 may not include a display device 1503, but may include display device interface circuitry (e.g., a connector and driver circuitry) to which display device 1503 may be coupled.

Computing device 1500 may include a processing device 1501 (e.g., one or more processing devices). As used herein, the term processing device or processor indicates a device that processes electronic data from registers and/or memory to transform that electronic data into other electronic data that may be stored in registers and/or memory. Processing device 1501 may include a memory 1521, a communication device 1522, a refrigeration/active cooling device 1523, a battery/power regulation device 1524, logic 1525, interconnects 1526 (i.e., optionally including redistribution layers (RDL) or metal-insulator-metal (MIM) devices), a heat regulation device 1527, and a hardware security device 1528.

Processing device 1501 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 1501 may include a memory 1502, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1521 includes memory that shares a die with processing device 1501. This memory may be used as cache memory and may include embedded dynamic random-access memory (eDRAM) or spin transfer torque magnetic random-access memory (STT-M RAM).

Computing device 1500 may include a heat regulation/refrigeration device 1506. Heat regulation/refrigeration device 1506 may maintain processing device 1501 (and/or other components of computing device 1500) at a predetermined low temperature during operation. This predetermined low temperature may be any temperature discussed elsewhere herein.

In some embodiments, computing device 1500 may include a communication chip 1507 (e.g., one or more communication chips). For example, the communication chip 1507 may be configured for managing wireless communications for the transfer of data to and from computing device 1500. The term “wireless” and its derivatives may be used to describe circuits, devices, systems, methods, techniques, communications channels, etc., that may communicate data through the use of modulated electromagnetic radiation through a nonsolid medium.

Communication chip 1507 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as “3GPP2”), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1507 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1507 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1507 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1507 may operate in accordance with other wireless protocols in other embodiments. Computing device 1500 may include an antenna 1513 to facilitate wireless communications and/or to receive other wireless communications (such as AM or FM radio transmissions).

In some embodiments, communication chip 1507 may manage wired communications, such as electrical, optical, or any other suitable communication protocols (e.g., the Ethernet). As noted above, communication chip 1507 may include multiple communication chips. For instance, a first communication chip 1507 may be dedicated to shorter-range wireless communications such as Wi-Fi or Bluetooth, and a second communication chip 1507 may be dedicated to longer-range wireless communications such as GPS, EDGE, GPRS, CDMA, WiMAX, LTE, EV-DO, or others. In some embodiments, a first communication chip 1507 may be dedicated to wireless communications, and a second communication chip 1507 may be dedicated to wired communications.

Computing device 1500 may include battery/power circuitry 1508. Battery/power circuitry 1508 may include one or more energy storage devices (e.g., batteries or capacitors) and/or circuitry for coupling components of computing device 1500 to an energy source separate from computing device 1500 (e.g., AC line power).

Computing device 1500 may include a display device 1503 (or corresponding interface circuitry, as discussed above). Display device 1503 may include any visual indicators, such as a heads-up display, a computer monitor, a projector, a touchscreen display, a liquid crystal display (LCD), a light-emitting diode display, or a flat panel display, for example.

Computing device 1500 may include an audio output device 1504 (or corresponding interface circuitry, as discussed above). Audio output device 1504 may include any device that generates an audible indicator, such as speakers, headsets, or earbuds, for example.

Computing device 1500 may include an audio input device 1510 (or corresponding interface circuitry, as discussed above). Audio input device 1510 may include any device that generates a signal representative of a sound, such as microphones, microphone arrays, or digital instruments (e.g., instruments having a musical instrument digital interface (MIDI) output).

Computing device 1500 may include a global positioning system (GPS) device 1509 (or corresponding interface circuitry, as discussed above). GPS device 1509 may be in communication with a satellite-based system and may receive a location of computing device 1500, as known in the art.

Computing device 1500 may include another output device 1505 (or corresponding interface circuitry, as discussed above). Examples include an audio codec, a video codec, a printer, a wired or wireless transmitter for providing information to other devices, or an additional storage device.

Computing device 1500 may include another input device 1511 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1500 may include a security interface device 1512. Security interface device 1512 may include any device that provides security measures for computing device 1500 such as intrusion detection, biometric validation, security encode or decode, managing access lists, malware detection, or spyware detection. In some examples, security interface device 1512 comprises OTP ROM further including a via MIM fuse, for example as described elsewhere herein.

Computing device 1500, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the disclosure is not limited to the embodiments so described, but instead can be practiced with modification and alteration without departing from the scope of the appended claims. For example, the above embodiments may include specific combinations of features as further provided below.

In first examples a transistor structure comprises a channel material having a first lateral width in a first dimension and a mask material over the channel material. The mask material has a second lateral width in the first dimension, the second lateral width larger than the first lateral width. A gate material is adjacent to the channel material and under the mask material. The gate material has a third lateral width in the first dimension, the third lateral width smaller than the second lateral width.

In second examples, for any of the first examples within the first dimension a first sidewall of the gate material is laterally offset from a first sidewall of the mask material by substantially a same distance as a second sidewall of the gate material is laterally offset from a second sidewall of the mask material.

In third examples, for any of the first through second examples within the first dimension, a centerline of the channel material is coincident with a centerline of the gate material.

In fourth examples, for any of the third examples within the first dimension, a sidewall of the gate material is recessed from a sidewall of the mask material by a distance that is symmetrical about a centerline of the first lateral width.

In fifth examples, for any of the first through fourth examples the mask material has a first lateral length in a second dimension, orthogonal to the first dimension, and the gate material has a second lateral length in the second dimension. The second lateral length is smaller than the first lateral length.

In sixth examples, for any of the fifth examples a difference between the first and second lateral lengths is unequal to a difference between the second and third lateral widths.

In seventh examples, for any of the first through sixth examples the transistor structure comprises a source and a drain coupled at opposite ends of the channel material within a second dimension substantially orthogonal to the first dimension. The source and the drain each comprise an impurity-doped material epitaxial to the channel material. The impurity-doped material has a fourth width in the first dimension, and the fourth width is larger than the first lateral width. The fourth width is asymmetrical about a centerline of the first lateral width.

In eighth examples, for any of the seventh examples the fourth width is larger than the third lateral width.

In ninth examples, for any of the first through eighth examples the channel material comprises a first channel material layer in a stack with a second channel material layer, and the gate material is between the first channel material layer and the second channel material layer.

In tenth examples, an integrated circuit (IC) device comprises a first transistor structure comprising a first channel material having a first lateral width in a first dimension, and a first gate material laterally adjacent to the first channel material. The first gate material has a second lateral width in the first dimension. The second lateral width is substantially centered with the first lateral width of the first channel material. The IC device comprises a second transistor structure laterally adjacent to the first transistor structure. The second transistor structure comprises a second channel material having the first lateral width in the first dimension, and a second gate material laterally adjacent to the second channel material. The second gate material has the second lateral width in the first dimension. The second lateral width is substantially centered with the first lateral width of the second channel material.

In eleventh examples, for any of the tenth examples the IC device further comprises a first mask material over the first gate material. The first mask material comprising a dielectric. The IC device further comprises second mask material over the second gate material, the second mask material comprising the dielectric. The IC device further comprises a dielectric material layer over the first mask material, over the second mask material and within a space therebetween. The dielectric material layer occludes a space between adjacent sidewalls of the first and second gate materials.

In twelfth examples, for any of the eleventh examples, within the first dimension, the space between the adjacent sidewalls of the first and second gate materials has a larger width than that of the space between the first mask material and the second mask material.

In thirteenth examples, for any of the tenth through twelfth examples at least a portion of the space between the adjacent sidewalls of the first and second gate materials is unfilled by the dielectric material layer.

In fourteenth examples, for any of the tenth through thirteenth examples the first transistor structure further comprises a first source and first drain coupled at opposite ends of the first channel material within a second dimension substantially orthogonal to the first dimension. The first source and the first drain comprise a first impurity-doped material epitaxial to the first channel material. The first impurity-doped material has a fourth lateral width in the first dimension, the fourth lateral width larger than the first lateral width. The second transistor structure further comprises a second source and a second drain coupled at opposite ends of the second channel material within the second dimension. The second source and the second drain each comprise a second impurity-doped material epitaxial to the second channel material. The second impurity-doped material has the fourth lateral width in the first dimension. Within the first dimension, a centerline of a space between the first source and the second source or between the first drain and the second drain is off-center from a centerline the first lateral width of the first channel material and the second channel material.

In fifteenth examples, for any of the tenth through fourteenth examples, within the first dimension, a centerline of a space between the first and second gate materials is substantially centered between a centerline the first lateral width of the first channel material and a centerline of the first lateral width of the second channel material.

In sixteenth examples, a method comprises patterning a first mask material over a transistor channel material, the first mask material of a first width in a first dimension. The method comprises forming a gate material adjacent to a sidewall of the transistor channel material below the first mask material. The method comprises forming a second mask material over the gate material and adjacent to the first mask material. The method comprises forming an opening in the second mask material by removing the first mask material. The method comprises expanding the opening to have a second width in the first dimension, larger than the first width and depositing a third mask material into the opening, the third mask material of the second width in the first dimension. The method comprises removing a portion of the gate material unprotected by the third mask material.

In seventeenth examples, for any of the sixteenth examples patterning the first mask material defines first lines extending in a second direction, orthogonal to the first dimension, and removing the portion of the gate material comprises etching a trench through a portion of the second mask material and through the portion of the gate material under the portion of the second mask material.

In eighteenth examples, for any of the seventeenth examples the method further comprises defining etch mask lines over the second and third mask materials, the etch mask lines substantially parallel to the first lines and etching the trench within a space between adjacent ones of the etch mask lines.

In nineteenth examples, for any of the sixteenth through eighteenth examples removing the portion of the gate material comprises defining a gate structure having a third width in the first dimension, the third width smaller than the second width.

In twentieth examples, for any of the nineteenth examples the method further comprises depositing a dielectric material over the third mask material, wherein the depositing occludes a second opening formed by removing the gate material.

However, the above embodiments are not limited in this regard, and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) device, comprising:

a first transistor structure comprising:

a first channel material having a first lateral width in a first dimension; and a first gate material laterally adjacent to the first channel material, wherein the first gate material has a second lateral width in the first dimension, the second lateral width substantially centered with the first lateral width of the first channel material; and a second transistor structure laterally adjacent to the first transistor structure, the second transistor structure comprising:

a second channel material having the first lateral width in the first dimension; and a second gate material laterally adjacent to the second channel material, wherein the second gate material has the second lateral width in the first dimension, the second lateral width substantially centered with the first lateral width of the second channel material.

2. The IC device of claim 1, further comprising:

a first mask material over the first gate material, the first mask material comprising a dielectric;

a second mask material over the second gate material, the second mask material comprising the dielectric; and a dielectric material layer over the first mask material, over the second mask material and within a space therebetween, the dielectric material layer occluding a space between adjacent sidewalls of the first and second gate materials.

3. The IC device of claim 2, wherein, within the first dimension, the space between the adjacent sidewalls of the first and second gate materials has a larger width than that of the space between the first mask material and the second mask material.

4. The IC device of claim 2, wherein at least a portion of the space between the adjacent sidewalls of the first and second gate materials is unfilled by the dielectric material layer.

5. The IC device of claim 1, wherein:

the first transistor structure further comprises:

a first source and first drain coupled at opposite ends of the first channel material within a second dimension substantially orthogonal to the first dimension, wherein:

the first source and the first drain comprise a first impurity-doped material epitaxial to the first channel material; and the first impurity-doped material has a fourth lateral width in the first dimension, the fourth lateral width larger than the first lateral width;

the second transistor structure further comprises:

a second source and a second drain coupled at opposite ends of the second channel material within the second dimension, wherein:

the second source and the second drain each comprise a second impurity-doped material epitaxial to the second channel material; and the second impurity-doped material has the fourth lateral width in the first dimension; and wherein, within the first dimension, a centerline of a space between the first source and the second source or between the first drain and the second drain is off-center from a centerline of the first lateral width of the first channel material.

6. The IC device of claim 1, wherein, within the first dimension, a centerline of a space between the first and second gate materials is substantially centered between a centerline of the first lateral width of the first channel material and a centerline of the first lateral width of the second channel material.

7. The IC device of claim 2, wherein, within the first dimension, a first sidewall of the first gate material is laterally offset from a first sidewall of the first mask material by substantially a same distance as a second sidewall of the first gate material is laterally offset from a second sidewall of the first mask material.

8. The IC device of claim 2, wherein:

the first mask material has a first lateral length in a second dimension, orthogonal to the first dimension; and the first gate material has a second lateral length in the second dimension, the second lateral length smaller than the first lateral length.

9. The IC device of claim 2, wherein the first channel material comprises:

a first channel material layer in a stack with a second channel material layer; and the first gate material is between the first channel material layer and the second channel material layer.

10. The IC device of claim 5, wherein the fourth lateral width is asymmetrical about a centerline of the first lateral width.

* * * * *